United States Patent
Kirihata et al.

(10) Patent No.: US 9,196,780 B2
(45) Date of Patent: Nov. 24, 2015

(54) SOLAR CELL

(71) Applicant: SANYO Electric Co., Ltd., Osaka (JP)

(72) Inventors: Yutaka Kirihata, Osaka (JP); Masato Nakasu, Osaka (JP); Naoya Sotani, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/582,505

(22) Filed: Dec. 24, 2014

(65) Prior Publication Data

US 2015/0114465 A1    Apr. 30, 2015

Related U.S. Application Data

(63) Continuation of application No. PCT/JP2012/066726, filed on Jun. 29, 2012.

(51) Int. Cl.

| | |
|---|---|
| *H01L 31/07* | (2012.01) |
| *H01L 31/075* | (2012.01) |
| *H01L 31/0352* | (2006.01) |
| *H01L 31/068* | (2012.01) |
| *H01L 31/0747* | (2012.01) |
| *H01L 31/18* | (2006.01) |

(52) U.S. Cl.
CPC ........ *H01L 31/075* (2013.01); *H01L 31/03529* (2013.01); *H01L 31/0682* (2013.01); *H01L 31/0747* (2013.01); *H01L 31/1804* (2013.01); *Y02E 10/547* (2013.01)

(58) Field of Classification Search
CPC ............ H01L 31/03529; H01L 31/075; H01L 31/0747; H01L 31/1804; H01L 31/0682; Y02E 10/547

USPC .................................. 136/252, 255, 256, 258
See application file for complete search history.

(56) References Cited

U.S. PATENT DOCUMENTS 8,288,645 B2 *   10/2012   Lee ................. H01L 31/022441
                                                                    136/252
2012/0090674 A1    4/2012   Takahama et al.

FOREIGN PATENT DOCUMENTS

| JP | WO 2010098445 A1 * | 9/2010 | ............ H01L 31/202 |
| JP | WO 2010098446 A1 * | 9/2010 | ...... H01L 31/022441 |
| WO | 2010/098445 A1 | 9/2010 | |

* cited by examiner

*Primary Examiner* — Matthew Martin
(74) *Attorney, Agent, or Firm* — Marvin A. Motsenboker; MOTS LAW, PLLC

(57) ABSTRACT

Disclosed is a solar cell that comprises a substrate made of a semiconductor material, a first amorphous semiconductor layer placed on one region of the substrate and being of one conductivity type, a second amorphous semiconductor layer placed on another region of the substrate and being of another conductivity type, a substantially intrinsic i-type amorphous semiconductor layer provided above the first amorphous semiconductor layer, a third amorphous semiconductor layer provided on the i-type amorphous semiconductor layer and being of the other conductivity type, a first crystalline semiconductor layer placed between the first amorphous semiconductor layer and the i-type amorphous semiconductor layer and being of the one conductivity type, and a second crystalline semiconductor layer placed between the first crystalline semiconductor layer and the i-type amorphous semiconductor layer and being of the other conductivity type.

10 Claims, 1 Drawing Sheet

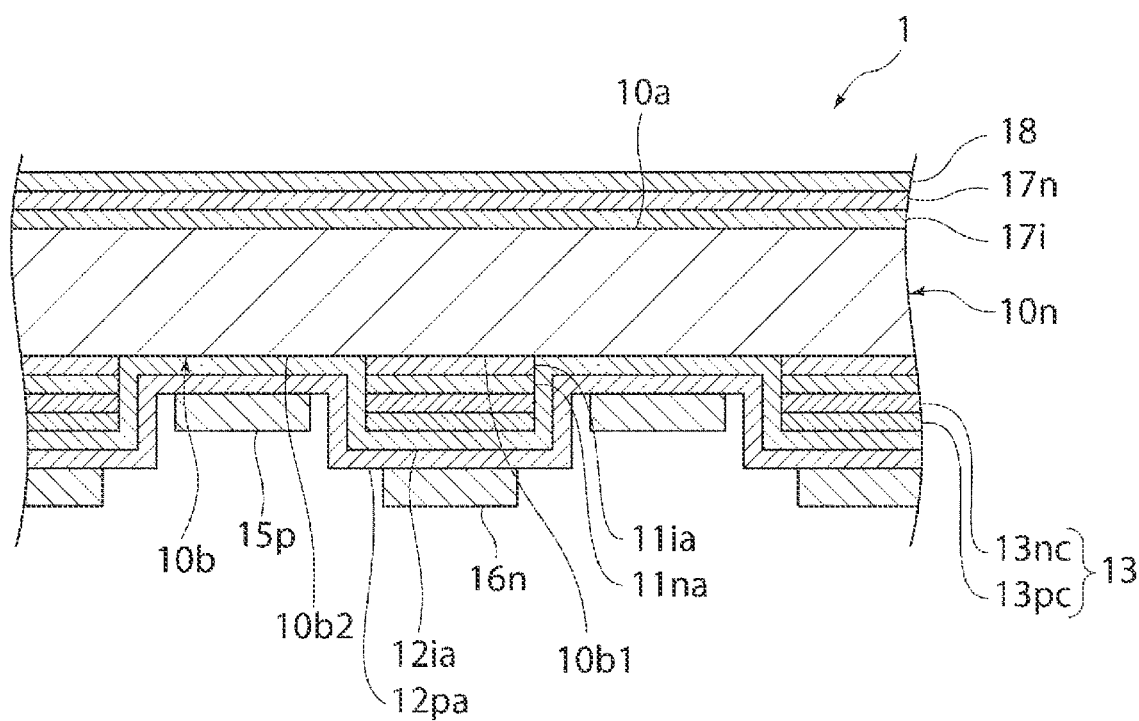

US 9,196,780 B2

SOLAR CELL

CROSS REFERENCE TO RELATED APPLICATIONS

This application is a continuation application of International Application No. PCT/JP2012/066726, filed on Jun. 29, 2012, entitled "SOLAR CELL", the entire contents of which are incorporated herein by reference.

TECHNICAL FIELD

The invention relates to a solar cell.

BACKGROUND ART

As a solar cell, which can improve electric conversion efficiency, PCT International Publication WO2010/098445A1 (Patent Document 1) describes a back contact solar cell having both of a p-side electrode and an n-side electrode provided on the back-surface side. The solar cell described in Patent Document 1 has a first semiconductor layer provided on a first region of one main surface of a substrate made of a semiconductor material and a second semiconductor layer provided on a second region of the one main surface. One of the first and second semiconductor layers is of a p-type, and the other one is of an n-type. The second semiconductor layer is provided to extend from the second region over onto the first semiconductor layer. In the first region, a recombination layer is provided between the first semiconductor layer and the second semiconductor layer. This recombination layer is a layer for forming a recombination interface where holes and electrons recombine.

SUMMARY OF THE INVENTION

There is a demand for further improvement in the photoelectric conversion efficiency of a solar cell.

A solar cell according to an embodiment includes a substrate made of a semiconductor material, a first amorphous semiconductor layer, a second amorphous semiconductor layer, a substantially intrinsic i-type amorphous semiconductor layer, a third amorphous semiconductor layer, a first crystalline semiconductor layer, and a second crystalline semiconductor layer. The first amorphous semiconductor layer is placed on one region of the substrate. The first amorphous semiconductor layer is of one conductivity type. The second amorphous semiconductor layer is placed on another region of the substrate. The second amorphous semiconductor layer is of another conductivity type. The i-type amorphous semiconductor layer is provided above the first amorphous semiconductor layer. The third amorphous semiconductor layer is provided on the i-type amorphous semiconductor layer. The third amorphous semiconductor layer is of the other conductivity type. The first crystalline semiconductor layer is placed between the first amorphous semiconductor layer and the i-type amorphous semiconductor layer. The first crystalline semiconductor layer is of the one conductivity type. The second crystalline semiconductor layer is placed between the first crystalline semiconductor layer and the i-type amorphous semiconductor layer. The second crystalline semiconductor layer is of the other conductivity type.

BRIEF DESCRIPTION OF THE DRAWINGS

FIG. 1 is a schematic sectional view of a solar cell according to first embodiment.

EMBODIMENTS

Hereinafter, examples of preferred embodiments carrying out the invention are described. It should be noted that the following embodiments are provided just for illustrative purposes. The invention should not be limited at all to the following embodiments.

In the drawings referred to in the embodiments and other parts, components having substantially the same function are referred to with the same reference numeral. In addition, the drawings referred to in the embodiments and other parts are illustrated schematically, and the dimensional ratio and the like of objects depicted in the drawings are different from those of actual objects in some cases. The dimensional ratio and the like of objects are also different among the drawings in some cases. The specific dimensional ratio and the like of objects should be determined with the following description taken into consideration.

First Embodiment

As illustrated in FIG. 1, solar cell 1 has substrate 10$n$ made of a semiconductor material. Substrate 10$n$ has n-type or p-type conductivity. In this embodiment, specifically, substrate 10$n$ is n-type conductivity. Substrate 10$n$ can be formed from, for example, an n-type crystalline semiconductor material or the like. Specifically, substrate 10$n$ can be formed from, for example, n-type crystalline silicon. Note that a crystalline semiconductor material includes a single-crystal semiconductor material and a polycrystalline semiconductor material and that crystalline silicon includes single-crystal silicon and polycrystalline silicon.

Substrate 10$n$ has first main surface 10$a$ for main light reception and second main surface 10$b$. First main surface 10$a$ is located on the light-receiving surface side. The "light-receiving surface" refers to a main surface for main light reception out of the two main surfaces.

On first main surface 10$a$, semiconductor layer 17$i$, semiconductor layer 17$n$, and protection layer 18 are provided in the order mentioned. Semiconductor layer 17$i$ is made of a substantially intrinsic i-type semiconductor material. Semiconductor layer 17$i$ can be formed from, for example, i-type amorphous silicon. Semiconductor layer 17$i$ preferably has a thickness which does not substantially contribute to power generation (e.g., about zero point several nanometers to 25 nm). Like substrate 10$n$, semiconductor layer 17$n$ has n-type conductivity. Semiconductor layer 17$n$ can be formed from, for example, n-type amorphous silicon. Protection layer 18 can be formed from, for example, silicon nitride or the like. Protection layer 18 may have a function of suppressing surface reflection of incident light, in addition to a function of protecting semiconductor layer 17$n$.

Amorphous semiconductor layer 11$na$ is placed above first region 10$b$1 of second main surface 10$b$. Amorphous semiconductor layer 11$na$ has the same conductivity as substrate 10$n$. Specifically, amorphous semiconductor layer 11$na$ has n-type conductivity, although amorphous semiconductor layer 11$na$ may be of a different conductivity type from substrate 10$n$. Amorphous semiconductor layer 11$na$ can be formed from, for example, n-type amorphous silicon.

Substantially intrinsic i-type amorphous semiconductor layer 11$ia$ is provided between first amorphous semiconductor layer 11$na$ and second main surface 10$b$. I-type amorphous semiconductor layer 11$ia$ has a thickness, which substantially does not contribute to power generation (e.g., about zero point several nanometers to 25 nm). I-type amorphous semiconductor layer 11*ia* can be formed from, for example, i-type amorphous silicon.

Substantially intrinsic i-type amorphous semiconductor layer 12*ia* is provided on second region 10*b*2 of second main surface 10*b*, second region 10*b*2 being at least part of a region excluding first region 10*b*1. Amorphous semiconductor layer 12*pa* is provided on i-type amorphous semiconductor layer 12*ia*. This amorphous semiconductor layer 12*pa* forms a second amorphous semiconductor layer and a third amorphous semiconductor layer. I-type amorphous semiconductor layer 12*ia* and amorphous semiconductor layer 12*pa* are provided to extend from second region 10*b*2 over onto amorphous semiconductor layer 11*na*. Thus, in first region 10*b*1, amorphous semiconductor layer 11*na* and amorphous semiconductor layer 12*pa* are stacked.

I-type amorphous semiconductor layer 12*ia* can be formed from, for example, i-type amorphous silicon. Preferably, i-type amorphous semiconductor layer 12*ia* has a thickness which substantially does not contribute to power generation (e.g., about zero point several nanometers to 25 nm).

Amorphous semiconductor layer 12*pa* is of a different conductivity type from substrate 10*n*. Specifically, amorphous semiconductor layer 12*pa* has p-type conductivity. Amorphous semiconductor layer 12*pa* can be formed from, for example, p-type amorphous silicon.

Crystalline semiconductor layer 13 is provided between first amorphous semiconductor layer 11*na* and i-type amorphous semiconductor layer 12*ia*. Crystalline semiconductor layer 13 is a layer for recombining holes and electrons. Crystalline semiconductor layer 13 has a defect level that can act as a recombination center. This facilitates recombination of electrons and holes in crystalline semiconductor layer 13. Consequently, current flows through crystalline semiconductor layer 13.

For example, crystalline semiconductor layer 13 has a thickness of preferably about 2 nm to 60 nm, or more preferably, 2 nm to 30 nm.

Crystalline semiconductor layer 13 has first crystalline semiconductor layer 13*nc* and second crystalline semiconductor layer 13*pc*. First crystalline semiconductor layer 13*nc* is provided on amorphous semiconductor layer 11*na*. First crystalline semiconductor layer 13*nc* is in contact with amorphous semiconductor layer 11*na*. First crystalline semiconductor layer 13*nc* is of the same conductivity type as amorphous semiconductor layer 11*na*. Specifically, first crystalline semiconductor layer 13*nc* has n-type conductivity. First crystalline semiconductor layer 13*nc* can be formed from, for example, n-type microcrystalline silicon. For example, first crystalline semiconductor layer 13*nc* has a thickness of preferably about 1 nm to 30 nm, or more preferably, 1 nm to 15 nm.

Second crystalline semiconductor layer 13*pc* is provided between first crystalline semiconductor layer 13*nc* and i-type amorphous semiconductor layer 12*ia*. Second crystalline semiconductor layer 13*pc* is in contact with each of first crystalline semiconductor layer 13*nc* and i-type amorphous semiconductor layer 12*ia*. Second crystalline semiconductor layer 13*pc* is of a different conductivity type from first crystalline semiconductor layer 13*nc*. Specifically, second crystalline semiconductor layer 13*pc* has p-type conductivity. Second crystalline semiconductor layer 13*pc* can be formed from, for example, p-type microcrystalline silicon. For example, second crystalline semiconductor layer 13*pc* has a thickness of preferably about 1 nm to 30 nm, or more preferably, 1 nm to 15 nm.

Note that a microcrystalline semiconductor layer is a layer containing multiple semiconductor crystal grains. A microcrystalline semiconductor layer includes a layer made substantially only of semiconductor crystal grains. Further, a microcrystalline semiconductor layer may have a semiconductor amorphous region in addition to semiconductor crystal grains.

In first region 10*b*1, n-side electrode 16*n* is provided on amorphous semiconductor layer 12*pa*. On the other hand, in second region 10*b*2, p-side electrode 15*p* is provided on amorphous semiconductor layer 12*pa*. Electrodes 15*p*, 16*n* can be formed from, for example, a conductive material containing at least one kind of metals such as Ag and Cu.

As described above, in solar cell 1, first crystalline semiconductor layer 13*nc* of the same conductivity type as amorphous semiconductor layer 11*na* is placed between amorphous semiconductor layer 11*na* and i-type amorphous semiconductor layer 12*ia*. Further, second crystalline semiconductor layer 13*pc* of a different conductivity type from first crystalline semiconductor layer 13*nc* is placed between first crystalline semiconductor layer 13*nc* and i-type amorphous semiconductor layer 12*ia*. Second crystalline semiconductor layer 13*pc* is of the same conductivity type as amorphous semiconductor layer 12*pa*. Thus, crystalline semiconductor layer 13 is placed between amorphous semiconductor layer 11*na* and i-type amorphous semiconductor layer 12*ia*, crystalline semiconductor layer 13 being a stack of first crystalline semiconductor layer 13*nc* of the same conductivity type as amorphous semiconductor layer 11*na* and second crystalline semiconductor layer 13*pc* of the same conductivity type as amorphous semiconductor layer 12*pa*. For this reason, the photoelectric conversion efficiency of the solar cell can be improved compared to a case where, for example, an amorphous semiconductor layer of the same conductivity type as the second amorphous semiconductor layer is provided between the first amorphous semiconductor layer and the i-type amorphous semiconductor layer. This is presumably because of a large effect of reduction in the electrical resistance between amorphous semiconductor layer 11*na* and n-side electrode 16*n*.

The following provides comparisons of electrical resistance between Example 1 of the invention and each of other modes, the electrical resistance of Example 1 being between substrate 10*n* and second crystalline semiconductor layer 13*pc*.

COMPARATIVE EXAMPLE 1

A solar cell is fabricated in a similar manner as to Example 1 except for providing a p-type amorphous silicon layer in place of first and second crystalline semiconductor layers 13*nc* and 13*pc*. Then, the electrical resistance between substrate 10*n* and the p-type amorphous silicon layer is measured. Table 1 depicts the result.

COMPARATIVE EXAMPLE 2

A solar cell is fabricated in a similar manner as to Example 1 except for providing a p-type amorphous silicon layer in place of second crystalline semiconductor layer 13*pc*. Then, the electrical resistance between substrate 10*n* and the p-type amorphous silicon layer is measured. Table 1 depicts the result.

COMPARATIVE EXAMPLE 3

A solar cell is fabricated in a similar manner as to Example 1 except for not providing first crystalline semiconductor layer 13nc. Then, the electrical resistance between substrate 10n and second crystalline semiconductor layer 13pc is measured. Table 1 depicts the result.

TABLE 1

|  |  | electrical resistance ($\Omega cm^2$) |
|---|---|---|
| Example 1 | μc-n/μc-p | 0.023 |
| Comparative Example 1 | a-p | 1.46 |
| Comparative Example 2 | μc-n/a-p | 1.56 |
| Comparative example 3 | μc-p | 0.38 |

The results in Table 1 show that provision of first and second crystalline semiconductor layers 13nc and 13pc enables reduction in the electrical resistance between substrate 10n and second crystalline semiconductor layer 13pc. Loss of electricity is therefore suppressed, which can consequently improve the photoelectrical conversion efficiency of the solar cell.

In this way, the embodiments described above can provide a solar cell with improved photoelectric conversion efficiency.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell comprising:
   a substrate;
   a first amorphous semiconductor layer arranged at a first region of the substrate and being of a first conductivity type;
   a second amorphous semiconductor layer arranged at a second region of the substrate and being of a second conductivity type;
   a substantially intrinsic i-type amorphous semiconductor layer provided above the first amorphous semiconductor layer;
   a third amorphous semiconductor layer provided on the i-type amorphous semiconductor layer and being of the second conductivity type;
   a first crystalline semiconductor layer arranged between the first amorphous semiconductor layer and the i-type amorphous semiconductor layer and being of the first conductivity type; and
   a second crystalline semiconductor layer arranged between the first crystalline semiconductor layer and the i-type amorphous semiconductor layer and being of the second conductivity type.

2. The solar cell according to claim 1, wherein
the first and second crystalline semiconductor layers are made of a microcrystalline semiconductor.

3. The solar cell according to claim 1, wherein
the one conductivity type is an n-type, and
the other conductivity type is a p-type.

4. The solar cell according to claim 1, further comprising:
a second substantially intrinsic i-type amorphous semiconductor layer provided between the first amorphous semiconductor layer and the substrate.

5. The solar cell according to claim 1, wherein
the first crystalline semiconductor layer has a thickness of about 1 nm to 30 nm.

6. The solar cell according to claim 1, wherein
the first crystalline semiconductor layer has a thickness of about 1 nm to 15 nm.

7. The solar cell according to claim 1, wherein
the second crystalline semiconductor layer has a thickness of about 1 nm to 30 nm.

8. The solar cell according to claim 1, wherein
the second crystalline semiconductor layer has a thickness of about 1 nm to 15 nm.

9. The solar cell according to claim 2, wherein
the microcrystalline semiconductor is made substantially of semiconductor crystal grains.

10. The solar cell according to claim 2, wherein
the second crystalline semiconductor includes a semiconductor amorphous region and a semiconductor crystal grains region.

* * * * *